United States Patent [19]

Fujioka

[11] Patent Number: 5,061,642
[45] Date of Patent: Oct. 29, 1991

[54] METHOD OF MANUFACTURING SEMICONDUCTOR ON INSULATOR

[75] Inventor: Hiroshi Fujioka, Tokyo, Japan

[73] Assignee: Fujitsu Limited, Kawasaki, Japan

[21] Appl. No.: 557,051

[22] Filed: Jul. 25, 1990

[30] Foreign Application Priority Data

Aug. 19, 1989 [JP] Japan ................................. 1-213428

[51] Int. Cl.$^5$ ..................................... H01L 21/477
[52] U.S. Cl. ..................................... 437/11; 437/24; 437/21; 437/248
[58] Field of Search ............... 437/10, 11, 24, 247; 148/DIG. 3, 248, 247

[56] References Cited

U.S. PATENT DOCUMENTS

| | | | |
|---|---|---|---|
| 4,622,082 | 11/1986 | Dyson et al. | 148/33 |
| 4,637,123 | 1/1987 | Cazcarra et al. | 29/569 R |
| 4,676,841 | 6/1987 | Celler | 148/1.5 |
| 4,749,660 | 6/1988 | Short et al. | 437/24 |
| 4,784,964 | 11/1988 | Hulseweh et al. | 437/26 |
| 4,786,608 | 11/1988 | Griffith | 437/24 |
| 4,804,633 | 2/1989 | Macelwee et al. | 437/24 |
| 4,837,172 | 6/1989 | Mizuno et al. | 437/11 |
| 4,868,133 | 9/1989 | Huber | 437/10 |
| 4,885,257 | 12/1989 | Matsushita | 437/11 |

FOREIGN PATENT DOCUMENTS 0060676 7/1985 European Pat. Off. .
0269349 8/1990 European Pat. Off. .

OTHER PUBLICATIONS

Journal of applied Physics, vol. 59, No. 10, May 1986, pp. 3495-3502, American Institute of Physics, Woodbury, N.Y., U.S.
H. J. Stein et al., "Rapid Thermal Annealing and Regrowth of Thermal Donors in Silicon" p. 3495, Abstract.

Primary Examiner—Olik Chaudhuri
Assistant Examiner—Steve Katz
Attorney, Agent, or Firm—Armstrong, Nikaido, Marmelstein, Kubovcik & Murray

[57] ABSTRACT

After the oxygen ion is implanted to the surface of (100) Si single crystal substrate, the annealing of about 10 cycles is conducted under the nitrogen gas ambience, wherein the high temperature of 1150° C. and low temperature of 450° C. are alternately repeated during one heat cycle of about seven minutes and thereby a Si single crystal layer is formed near the surface and the SiO$_2$ insulator is then formed just under the Si single crystal layer.

10 Claims, 5 Drawing Sheets

METHOD OF MANUFACTURING SEMICONDUCTOR ON INSULATOR

BACKGROUND OF THE INVENTION

1. Field of the Invention

The present invention relates to a method of forming SOI (Semiconductor On Insulator) structure by SIMOX (Separation by Implanted Oxygen) method and particularly to a method of forming SOI structure containing less crystal defects.

Since a substrate having the SOI structure (hereinafter called a SOI substrate) has excellent merits, when devices are formed thereon, that is, a parasitic capacitance is small and high speed operation of devices can be realized, device isolation can be done easily, immunity from radiation such as alpha rays is high and a high voltage resistant device may be formed, etc., practical application into MOS IC, etc. is now often attempted.

2. Description of the Related Art

A substance formed by the SIMOX method is an example of the SOI substrate. In the SIMOX method, a silicon dioxide ($SiO_2$) layer is formed in a silicon single crystal substrate by ion implantation method of oxygen. Usually, the oxygen ion of 80~200 KeV is implanted in the dose of $10^{17} \sim 10^{18}$ cm$^{-3}$ and thereafter the annealing is carried out at the temperature of about 1100° C. Thereby, a neighboring layer of the surface which has changed to an amorphous layer is then single-crystallized and a $SiO_2$ layer is formed in the region thereunder where the concentration of implanted oxygen becomes maximum in such a manner as taking also the oxygen in the vicinity of surface. The silicon single crystal layer in the vicinity of the surface corresponds to SOI and this layer is used for formation of devices such as IC, etc. The SIMOX method and application into devices are described, for example, Sorin Cristoloveanu: "Electrical Evaluation of SIMOX Material and Integrated Devices" Material Research Society Symposium Proceedings Vol. 107, p. 335-p. 347, 1988.

The SOI substrate formed by SIMOX method is hereinafter called a "SIMOX substrate" and silicon single crystal layer formed on the insulation film of "SIMOX substrate" is called the "SIMOX SOI". The manufacturing condition of the "SIMOX substrate" used actually is, for example, as follows:

The original silicon single crystal substrate is an n-type wafer having a specific resistance of 1 kΩ-cm and surface orientation of (100). The oxygen ion is implanted to the surface of this wafer in the implantation energy of 150 KeV and dose of $1 \times 10^{18}$ cm$^{-2}$. Under this condition, the project range of oxygen ion is 0.37 μm. Thereafter, this substrate is subjected to the heat treatment for 60 min. at 1200° C. in the nitrogen ambience. As a result, the $SiO_2$ insulation film formed thereby has the thickness of about 200 nm and the silicon single crystal layer, namely "SIMOX SOI" formed thereon has the thickness of about 200 nm.

However, this "SIMOX SOI" usually has the crystal defect of $1 \times 10^7$ cm$^{-2}$. If the "SIMOX SOI" having such many crystal defects is formed, leak current increases and thereby it becomes difficult to obtain a device having good device characteristics.

SUMMARY OF THE INVENTION

It is an object of the present invention to perform "SIMOX SOI" which ensures less crystal defects and good device characteristics.

This object may be obtained by executing the method described below. Namely, after the oxygen ion is implanted into a silicon single crystal substrate by the conventional method the "SIMOX substrate" is annealed, during heat treatment thereof through the heat cycle where the temperature of 1100° C. or higher and the temperature of 500° C. or lower are alternatively repeated.

For this annealing through such a heat cycle, the "SIMOX substrate" is radiated and heated by a tungsten lamp in the heat treatment chamber of nitrogen gas ambience forming a heat treatment apparatus such as a rapid thermal annealer. The tungsten lamp is controlled so as to conduct the annealing by a heat cycle for the "SIMOX substrate".

With such heat cycle annealing, a silicon single crystal layer, namely "SIMOX SOI" is formed in the vicinity of the surface of "SIMOX substrate" and a $SiO_2$ insulation layer is formed just under the "SIMOX SOI".

According to the result of experiments for evaluating crystal defect on the "SIMOX SOI" by the etch pit at the surface, the measured etch pit density of $1 \times 10^7$ cm$^{-2}$ is reduced to about $1 \times 10^6$ cm$^{-2}$ as a result of heat cycle annealing of 10 times of more. Moreover, it has been confirmed in the heat cycle annealing that the etch pit density of $1 \times 10^7$ cm$^{-2}$ before the heat cycle annealing is reduced to about $1 \times 10^6$ cm$^{-2}$ after the heat cycle annealing of 10 times by selecting the high temperature to 1100° C. or higher and the low temperature to 500° C. or less.

Therefore, the "SIMOX SOI" formed by the present invention assures excellent device characteristics.

DESCRIPTION OF THE PREFERRED EMBODIMENTS

An embodiment of the present invention will be explained hereunder with reference to FIG. 1 to FIG. 6.

Figure 1:
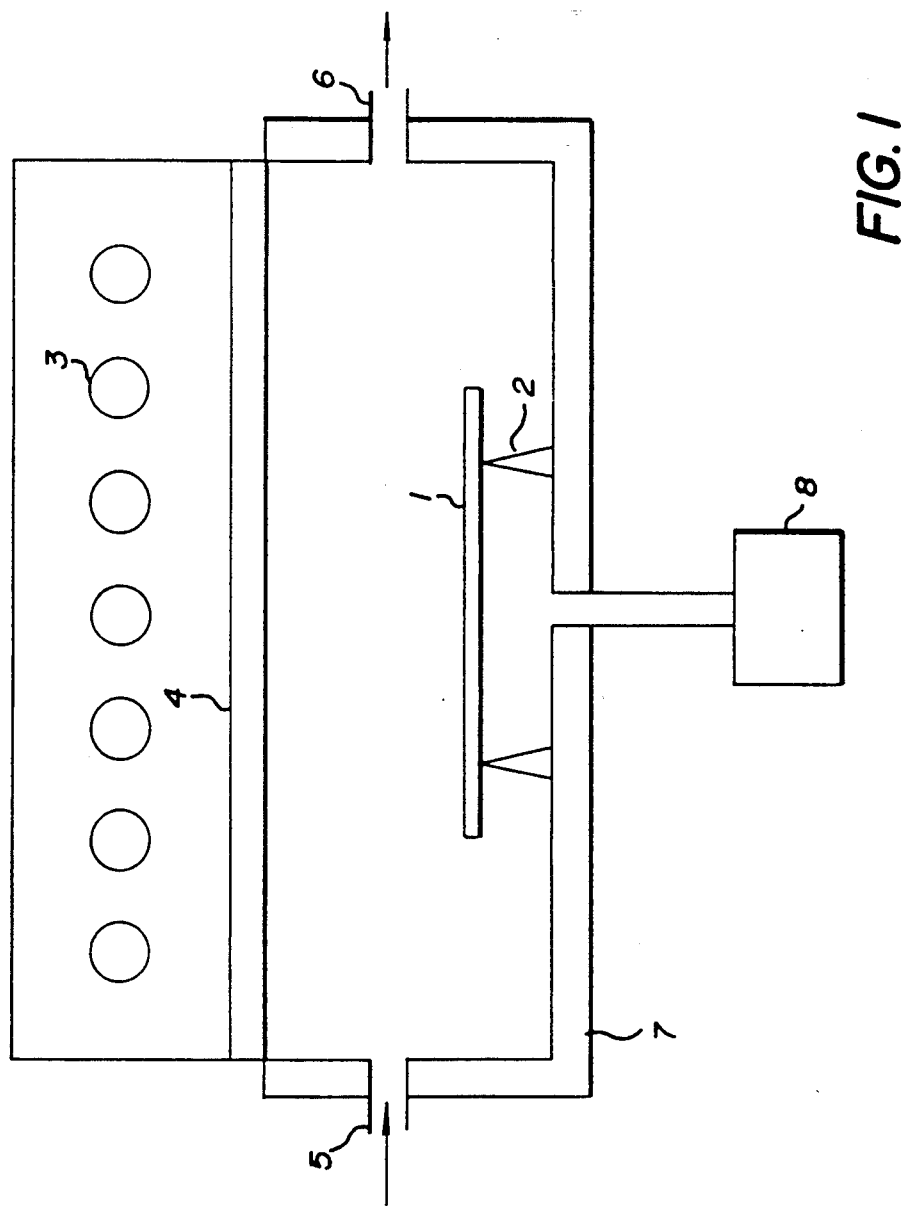
FIG. 1 is a schematic diagram of a heat treatment apparatus for heat treatment of the "SIMOX substrate"

"SIMOX substrate" 1 is carried into the heat treatment chamber 9 of the heat treatment apparatus such as a rapid thermal annealer shown in FIG. 1 and is then placed on a substrate holder 2. At the upper part of heat treatment apparatus, a plurality of tungsten lamps are provided as the light source 3 for heat treatment in order to irradiate the "SIMOX substrate" 1 through a quartz plate 4. The nitrogen gas is introduced into the heat treatment chamber 9 through a gas entrance 5 and is exhausted through a gas exit 6. The heat treatment chamber 9 is formed by on external wall of quartz and the external surface thereof is evaporated with aluminum film 7 to obtain a uniform chamber temperature. The temperature of "SIMOX substrate" 1 is controlled by a pyrometer 8 provided at the lower part of the heat treatment chamber. The total electrical power of the tungsten lamps becomes about 20 KW in order to heat the "SIMOX substrate" up to 1150° C. In this embodiment, the N$_2$ gas is introduced into the heat treatment chamber 9 but hydrogen (H$_2$) or an inert gas such as argon (Ar), helium (He), krypton (Kr) or xenon (Xe) may also be used. Moreover, in case the heat treatment is carried under the vacuum environment by evacuating the heat treatment chamber 9, a more uniform temperature distribution is assured for entire part of the "SIMOX substrate".

Figure 2:
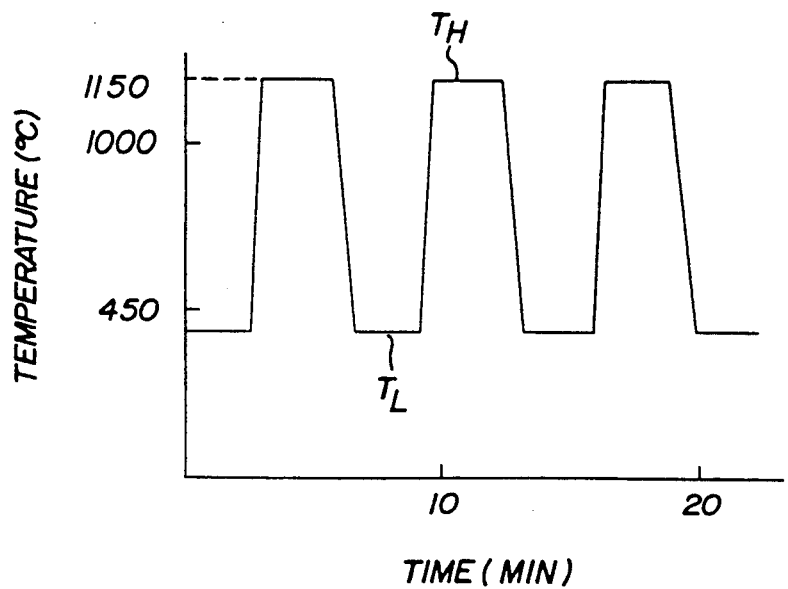
FIG. 2 is a heat cycle diagram by the present invention for heat treatment of the "SIMOX substrate"

FIG. 2 is a heat cycle diagram for heat treatment to "SIMOX substrate" 1. In this heat cycle, the high temperature $T_H$ is set to 1150° C. and the low temperature $T_L$ to 450° C., the holding time of $T_H$ and $T_L$ is respectively set to 10 seconds to several tens of minutes and most desirable holding time is 3 to 4 minutes. Therefore, one heat cycle time is about 7 minutes.

Figure 3:
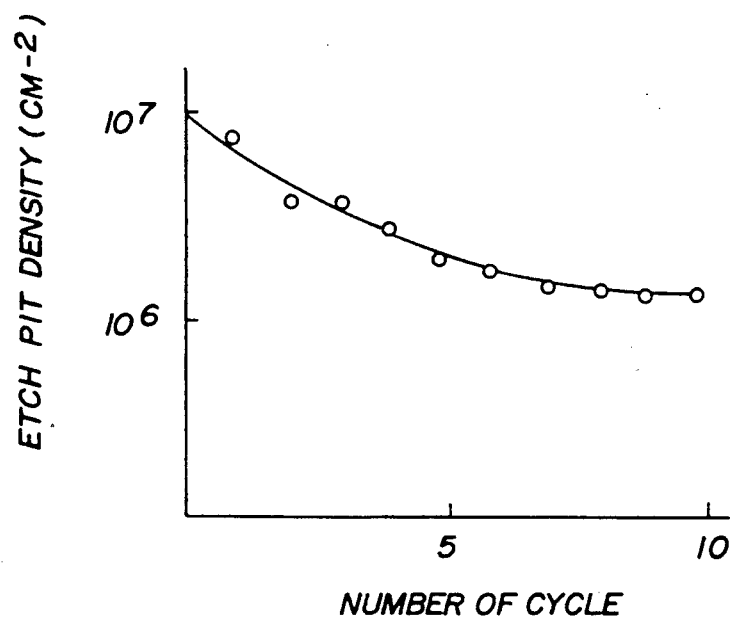
FIG. 3 is an experimental curve indicating relationship between the etch pit density of "SIMOX SOI" and a number of heat cycles.

In the heat treatment for the "SIMOX substrate" 1 in accordance with the heat cycle of FIG. 1, the density of etch pits appearing in the etching of "SIMOX substrate" is measured in each heat cycle. A curve plotting the density value of etch pits for the number of heat cycles is shown in FIG. 3. In this step, the etching is carried out for 15 sec. using the Wright's etching solution. (Wright's etching solution is a solution obtained by the mixing of hydrofluoric acid of 60 cc; nitric acid of 30 cc; chromic acid (5 mol/l) of 30 cc; copper nitrate of 2 g, water of 60 cc and acetic acid of 60 cc.) As is shown in FIG. 3, the density of etch pits gradually reduces with the increase of the number of heat cycles from the value $1 \times 10^7$ cm$^{-2}$ before the heat treatment and the reduction is saturated from the fifth heat cycle. In the tenth heat cycle, to density becomes about $1 \times 10^6$ cm$^{-2}$.

Figure 4:
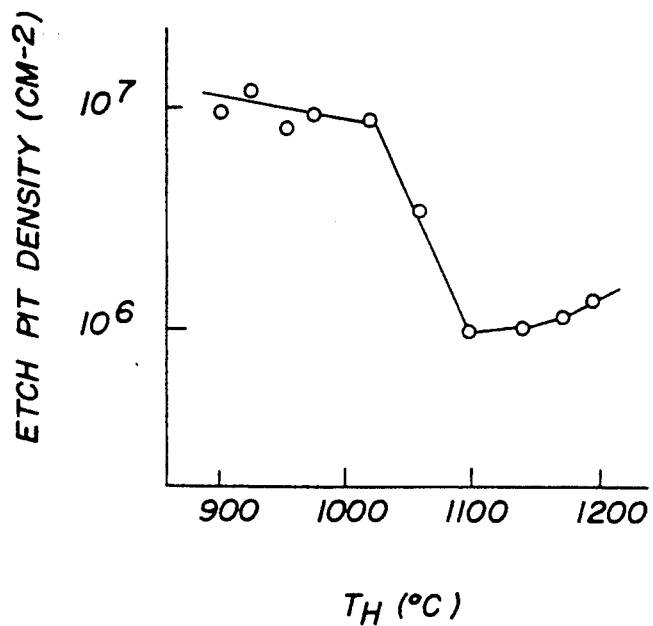
FIG. 4 is an experimental curve indicating relationship between the etch pit density of "SIMOX SOI" and $T_H$ after the 10 cycles annealing with $T_L$ kept constant at 450° C.
Figure 5:
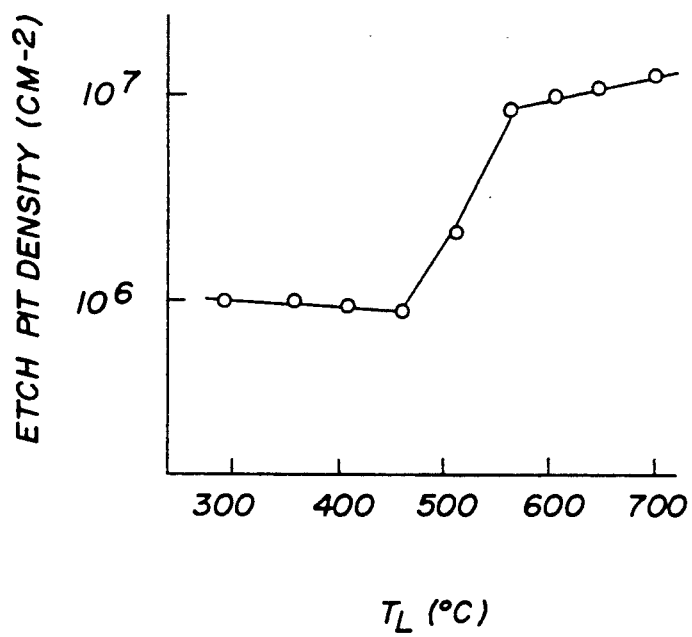
FIG. 5 is an experimental curve indicating relationship between the etch pit density of "SIMOX SOI" and $T_L$ after the 10 cycles annealing with $T_H$ kept constant at 1150° C.

Next, the experimental result for determining the optimum values for the high temperature $T_H$ and low temperature $T_L$ in the heat cycle of FIG. 1 is shown in FIG. 4 and FIG. 5.

First of all, $T_L$ is kept to a constant value of 450° C. in the heat cycle, while $T_H$ is set to several temperature values from 900° C. to 1200° C. In any case, the "SIMOX substrate" is subjected to the annealing by 10 cycles, etch pit density of "SIMOX SOI" is measured after 10 cycles, and these values are plotted against $T_H$ in the heat cycle. A curve thus obtained is shown in FIG. 4. From FIG. 4, it is obvious when $T_H$ is about 1100° C. or higher, the density of etch pits is reduced to about $1 \times 10^6$ cm$^{-2}$ from the value $1 \times 10^7$ cm$^{-2}$ before the heat treatment.

Moreover, $T_H$ in the heat cycle is fixed to 1150° C., while $T_L$ is set to several values in the range from 300° C. to 700° C. In any cases, the "SIMOX substrate" is subjected to the annealing by 10 cycles, the etch pit density of "SIMOX SOI" is measured after 10 cycles, and these values are plotted against $T_L$ in the heat cycle. As shown in FIG. 5, when $T_L$ is about 500° C. or lower, to density of etch pits is reduced to about $1 \times 10^6$ cm$^{-2}$ from the value $1 \times 10^7$ cm$^{-2}$ before the heat treatment.

In this embodiment, $T_H$ and $T_L$ of heat cycle for annealing the "SIMOX substrate" are respectively fixed to constant values. However, $T_H$ must be 1100° C. in minimum and $T_L$ must be 500° C. in maximum, and these are not required to be constant.

With a MOSFET having a channel length of 2 μm manufactured as an example utilizing SIMOX SOI, the leak current is 0.005 pA per gate width 1 μm. It is equal to 1/20 of the leak current of a similar MOSFET fabricated by using conventional methods.

Next, a method of manufacturing a MOSFET utilizing the method of the present invention will be explained with reference to FIGS. 6(a)~6(f).

Figure 6A:
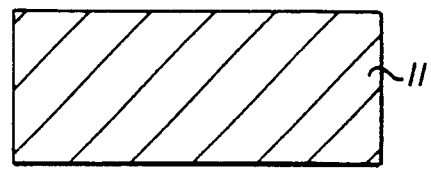
FIG. 6(a) is a step diagram for ion implantation of oxygen $O^+$ to the surface of Si substrate.

As shown in FIG. 6(a), the oxygen ion O$^+$ is implanted, with an energy of 150 KeV and a concentration of $1 \times 10^{18}$ cm$^{-2}$, to the surface of Si substrate 11 having resistivity of 1 KΩ, and surface orientation of (100).

Figure 6B:
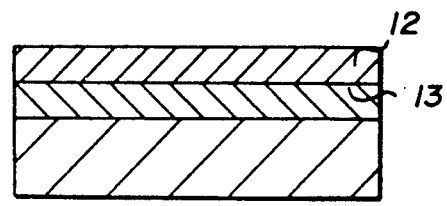
FIG. 6(b) is a step diagram for forming a Si single crystal layer under the surface of sample and then forming a $SiO_2$ layer just under the Si single crystal layer by the heat cycle annealing.

This sample is subjected to the heat cycle annealing under the nitrogen ambience. The heat cycle annealing to be conducted is shown in FIG. 2 and a number of heat cycles is set to 10 cycles. As a result of this heat cycle annealing, the Si single crystal layer 12 is formed in the region up to the depth of 200 nm from the surface of sample and the SiO$_2$ layer 13 is formed, just under this layer, in the region up to the depth of 400 nm from the surface of sample. This condition is shown in FIG. 6(b).

Figure 6C:
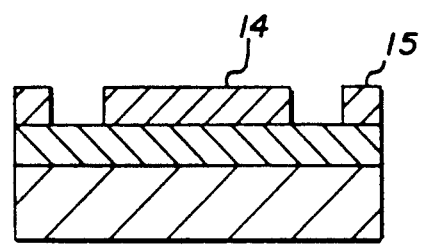
FIG. 6(c) is a step diagram for channel doping of boron ion ($B^+$) to the surface single crystal layer after the etching for device isolation.

Next, as shown in FIG. 6(c), after a device region 14 and the adjacent region 15 are formed for the device isolation to the surface single crystal layer, the boron ion (B$^+$) in the concentration of $1 \times 10^{12}$ cm$^{-2}$ is implanted to the device region 14 as the channel doping.

Figure 6D:
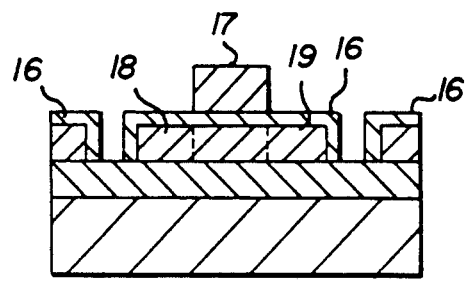
FIG. 6(d) is a step diagram for conducting gate etching after the gate oxidation and then growth of n-type poly-Si and then forming the source . drain by selectively implanting arsenic ion (As)

As shown in FIG. 6(d), the SiO$_2$ layer 16 of 150 Å is formed by the gate oxidation at 1000° C., and n-type poly-Si 17 is formed on layer 16. Next, the source 18 and drain 19 are formed by implanting the arsenic ion (As$^+$) with energy of 100 KeV and a concentration of $1 \times 10^{16}$ cm$^{-2}$.

Figure 6E:
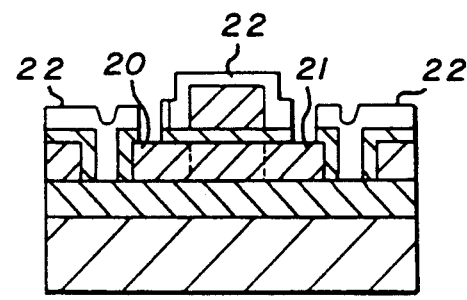
FIG. 6(e) is a step diagram for providing contact holes respectively to the source and drain after forming the SiO$_2$ layer at the sample surface.

As shown in FIG. 6(e), after the SiO$_2$ layer is formed on the surface of sample and the contact holes 20, 21 are opened respectively to the source 18 and drain 19.

Figure 6F:
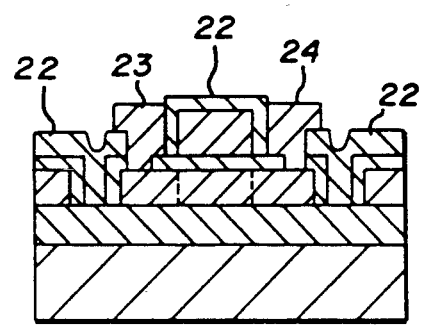
FIG. 6(f) is a step diagram for forming the wirings to the source and drain, respectively and completing an n-channel MOSFET.

Finally, as shown in FIG. 6(f), the aluminum (Al) wirings 23, 24 are formed respectively to the source 18 and drain 19 through the contact holes 20, 21, thereby completing the n-channel MOSFET.

In this embodiment, the MOSFET has been formed as a device but the device is not limited thereto and may be a bipolar transistor or photosensor.

What is claimed is:

1. A method of manufacturing a substrate having a silicon single crystalline layer on insulator comprising the steps of:

forming an intermediate layer including oxygen leaving the silicon layer under a surface of the substrate, the oxygen being doped by the ion implantation method; and conducting heat cyclic annealing to said silicon crystal substrate in which the temperature of 1100° C. or higher and 500° C. or lower are alternatively repeated, such that dislocations originating from an interface between the silicon layer and the intermediate layer are reduced.

2. A method of manufacturing a substrate having a silicon single crystalline layer on insulator according to claim 1, wherein said heat cyclic annealing is repeated for five times or more.

3. A method of manufacturing a substrate having a silicon single crystalline layer on insulator according to claim 1, wherein the high temperature value in each cycle is set in the range from 1200° C. to 1400° C. and the low temperature value in the range from 200° C. to 400° C.

4. A method of manufacturing a substrate having a silicon single crystalline layer on insulator according to claim 3, wherein the high temperature and low temperature holding time in each cycle is 10 seconds or longer.

5. A method of manufacturing a substrate having a silicon single crystalline layer on insulator according to claim 1, wherein said heat annealing is carried out under the ambience of gas selected from the group consisting of nitrogen, hydrogen, argon, helium, krypton and xenon.

6. A method of manufacturing a substrate having a silicon substrate single crystalline layer on insulator according to claim 1, wherein said heat cyclic annealing is carried out under the vacuum condition.

7. A method of manufacturing a substrate having a silicon single crystalline layer on insulator according to claim 1, wherein said heat cyclic annealing is carried out by a radiation heating apparatus.

8. A method of manufacturing a substrate having a silicon single crystalline layer on insulator according to claim 7, wherein tungsten lamps are used as the radiator of a radiation heating apparatus.

9. A method of manufacturing a substrate having a silicon single crystalline layer on insulator according to claim 1, wherein a concentration of oxygen ions to be implanted is selected from the range of $0.2 \times 10^{18}$ $cm^{-2} \sim 5 \times 10^{18}$ $cm^{-2}$.

10. A method of manufacturing a substrate having a silicon single crystalline layer on insulator according to claim 1, wherein semiconductor devices are formed on said surface of silicon layer.

* * * * *